US011602080B1

(12) United States Patent
Gao

(10) Patent No.: US 11,602,080 B1
(45) Date of Patent: Mar. 7, 2023

(54) ACCURATE RACK-BASED LEAKAGE TRACKING

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 8 days.

(21) Appl. No.: 17/465,524

(22) Filed: Sep. 2, 2021

(51) Int. Cl.
*H05K 7/20* (2006.01)
*G01M 3/18* (2006.01)

(52) U.S. Cl.
CPC ......... *H05K 7/20509* (2013.01); *G01M 3/183* (2013.01); *H05K 7/20781* (2013.01)

(58) Field of Classification Search
CPC .......... H05K 7/20509; H05K 7/20272; G01M 3/183
See application file for complete search history.

(56) References Cited

U.S. PATENT DOCUMENTS

| 9,883,616 | B2* | 1/2018 | Chainer | H05K 7/20781 |
| 11,177,492 | B2* | 11/2021 | Kawase | H01M 8/04201 |
| 2007/0051166 | A1* | 3/2007 | Baker | G01M 3/188 |
| | | | | 73/40.5 R |

* cited by examiner

*Primary Examiner* — Mukundbhai G Patel
(74) *Attorney, Agent, or Firm* — Womble Bond Dickinson (US) LLP

(57) ABSTRACT

A leak detection system for a server rack can include a detection channel that has a top region and a bottom region. The detection channel includes one or more openings at the top region. Each opening is to receive an outlet port of a server chassis installed in the IT rack. A cover for each of the one or more openings is arranged over the one or more openings when the outlet port is not present in the one or more openings and moves to allow entrance of the outlet port when the outlet port is inserted into the one or more openings. A fluid sensor for each of the one or more openings is arranged within the detection channel to detect a fluid that is deposited from the outlet port. Each fluid sensor is positioned within the detection channel to optimally detect presence of the fluid.

20 Claims, 8 Drawing Sheets

(BACK VIEW)

(TOP VIEW)

(SIDE)

(FRONT)

(SIDE)

(FRONT)

ACCURATE RACK-BASED LEAKAGE TRACKING

FIELD

Embodiments of the present disclosure relate generally to a leak detection system for a server rack. In particular, the leak detection system detects leaks with improved accuracy in a manner that can identify which server chassis level granularity on the server rack is leaking.

BACKGROUND

Information Technology (IT) includes technology such as computers that are accessible through the internet or a local network, which provide storage of, or access to, data, websites, computer programs, algorithms, services, and more. IT equipment such as servers and other electronic devices (e.g., peripheral devices) can be installed in a chassis. These server chassis can then be installed in a server rack, which is also referred to herein as an IT rack. An IT rack can be populated with a plurality of server chassis, each server chassis housing one or more printed circuit board where the electronics devices and integrated circuits are packaged. The server chassis can serve to manage power, thermal requirements, electronic connectivity and wiring, mechanical and structural support, and other considerations of the IT equipment.

One important design feature in a server rack cooling system is to provide a fluid distribution system that carries fluid (e.g., a liquid coolant) between a server rack and each server chassis and between the server chassis and the IT components (e.g., electronic components) that is mounted on the chassis. Such a system is to provide high operational power and cooling efficiency of the IT equipment, and at the same time, function with high reliability.

Liquid cooling for high power density electronics has increased in popularity because air cooling can be thermally insufficient in some circumstances. Liquid cooling allows for higher packaging density and increased computing load of electronics, by properly transferring the heat load generated by the electronics and at the same time, providing proper thermal environment.

Liquid cooling systems can be susceptible to fluid leaks, which can damage IT equipment. For example, fluid flows through many components joined together by fluid lines. As the number of connection points increase, so does the likelihood of a leak, given that each connection point poses an increased risk of failure. Manufacturing defect, improper installation, or other factors can result in a fluid leak. Fluid leaks can cause permanent damage to electronics such as, for example, servers, peripherals, power supplies, fans. Fluid leaks can also cause the equipment to malfunction or shutdown for maintenance, resulting in unwanted downtime. Thus, a server rack should be resistant to fluid leaks in a manner that protects the IT equipment.

Further, even if a design is resistant to fluid leaks, given the high cost of some IT equipment, detection of a leak may be beneficial. A server rack may react and take remedial measures when a leak is detected, to reduce risk. Thus, there is a need for a cooling solution that addresses issues described.

A leak detection sensor may perform in various ways depending on the detection mechanism. Further, different types of leak detection sensors exist, using different types of technologies. Some fluid detection sensors may be more accurate in detecting presence of a leak than others, however, there are trade-offs. A fluid detection sensor with high accuracy may significantly increase the hardware cost, or it may not be durable, or it may have a relatively small coverage area. A fluid detection sensor with low accuracy may not detect and identify every leak scenario in a server rack. Therefore, given the trade-offs, a proper hardware design for implementing a detection sensor is desirable. A feasible direction is to develop an advanced hardware component for implementing fluid sensors more efficiently and for enabling the sensor to perform accordingly.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Figure 1:
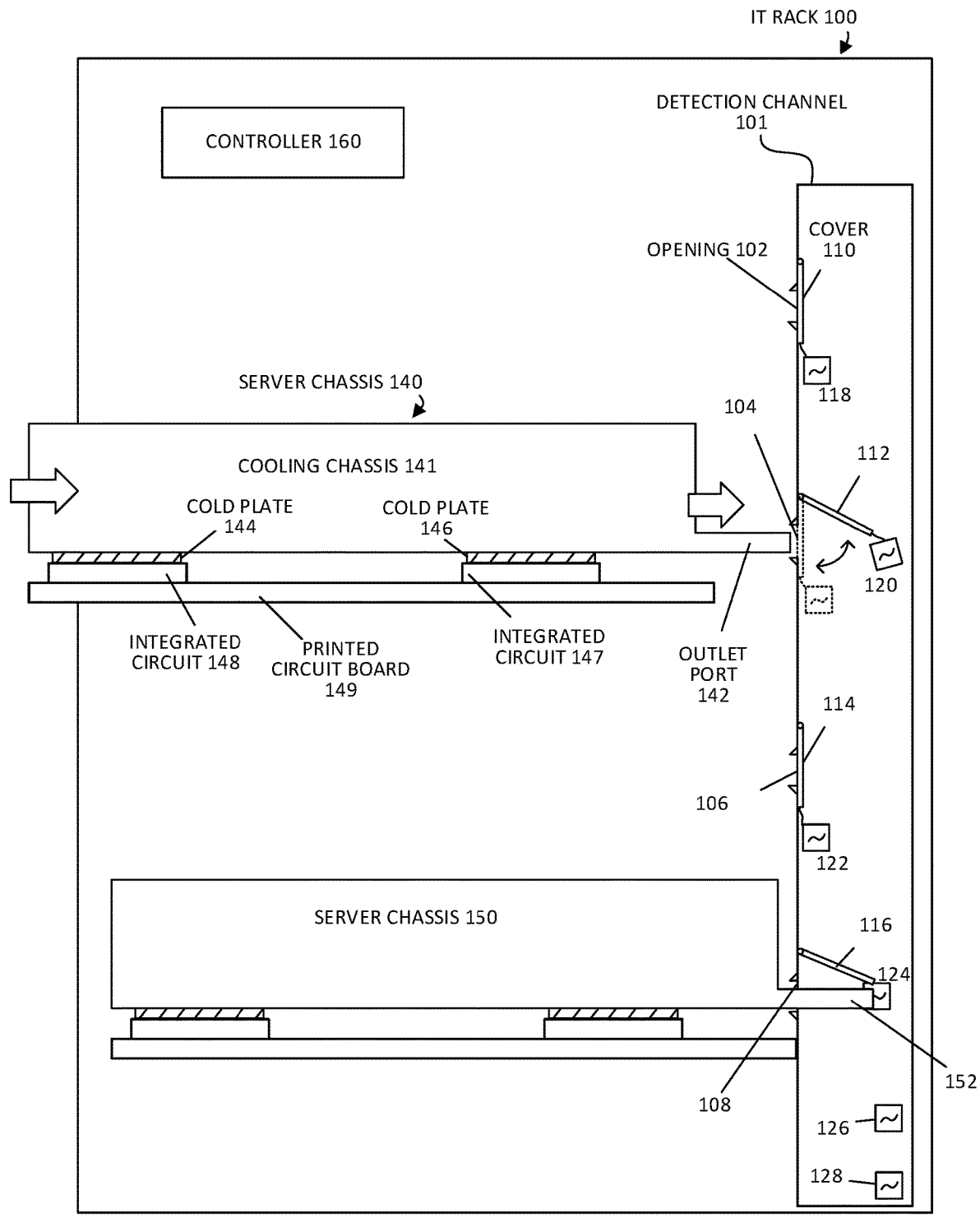
FIG. 1 shows a leak detection system for an IT rack, according to some embodiments.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

Liquid cooling systems can circulate fluid to and from IT electronics within an IT rack. Within an IT rack, leaks within the liquid cooling system can be common, due to the various conduits, connectors, fittings, adapters, cold plates, and other parts that the fluid travels through or interfaces with. Fluid can leak at different rates, depending on the severity of the leak. A cooling system for an IT rack can have a two-part hardware design that serves to isolate the electronics from the liquid cooling loops to segregate from potential leaked fluid as well as gather the leaked fluid into a designated region for detection. Taken together, such a design can reduce the impact of a leak towards IT equipment and improve reliability.

For example, a server rack can include hardware such as a cooling chassis that isolates leaked fluid from electronic components housed in the server rack. This leaked fluid can be directed out of the server rack through an outlet port and into a detection channel which can be installed in the IT rack. A fluid sensor can detect presence of leaked fluid that originates from each of the server chassis installed on the IT rack. A controller can be configured to fluidly disconnect a leaking server chassis, and/or take other remedial measures, as described in other sections.

Small leaks may be difficult for sensors to detect. Sensors may not trigger unless submerged in at least a threshold amount of fluid. A proper hardware design is important for efficiently implementing the sensors to accurately detect the fluid leaks. Further, given the many potential points of leakage in an IT rack, it is impractical to place sensors at each potential point of failure. Directing the leaked fluid in a manner that allows for detection of fluid leaks on a per-server chassis basis is beneficial, so that a leaky server chassis can be potentially isolated without shutting down every remaining server chassis in the IT rack. Thus, features described in the present disclosure can improve accuracy of fluid sensors while also allowing for detection of leaks for each server chassis, individually, on the IT rack.

Generally, a server chassis may include a cooling chassis that has an outlet port that provides a path for a leaked fluid to flow out of an interior of the cooling chassis and one or more cold plates located at or fixed to a bottom portion of the cooling chassis. Fluid lines may be arranged in the interior of the cooling chassis to fluidly connect the one or more cold plates to a supply line and a return line, which can be fluidly connected to a rack manifold.

In some aspects, a leak detection system for an IT rack includes a detection channel. The detection channel can include one or more openings that is each to receive an outlet port of a server chassis installed in the IT rack. The detection channel includes a cover for each of the one or more openings that arranges itself over the one or more openings when the outlet port is not present in the one or more openings and moves itself off of the opening to allow entrance of the outlet port when the outlet port is inserted into the one or more openings. The detection channel includes a fluid sensor for each of the one or more openings, arranged within the detection channel to detect a fluid that is deposited from the outlet port. Other aspects and embodiments are described.

FIG. 1 shows a leak detection system for an IT rack, according to some embodiments. A leak detection system can include a detection channel 101 having one or more openings such as, for example, opening 102, 104, 106, and 108. Each opening is to receive an outlet port of a server chassis installed in the IT rack. For example, server chassis 140 has an outlet port 142 that is inserted into and resides in opening 104 of the detection channel 101 when the server chassis is installed in the IT rack. Similarly, server chassis 150 has an outlet port 152 that is inserted into opening 108 of the detection channel. The outlet port resides in the server chassis such that, if a leak occurs in the server chassis, the leaked fluid is captured by the server chassis and is directed to flow out of the server chassis and into the detection channel through the outlet port. In particular, the leaked fluid is captured by the cooling chassis 141, which is further described in other sections.

The detection channel 101 includes a cover for each of the one or more openings that is arranged over the one or more openings when the outlet port is not present in the one or more openings and moves to allow entrance of the outlet port when the outlet port is inserted into the one or more openings. For example, cover 110 is arranged over opening 102, cover 112 is arranged over opening 104, cover 114 is arranged over opening 106, and cover 116 is arranged over opening 152. Each of the covers can be self-arranging, for example, they automatically move over each opening when the outlet port is not present (e.g., with a spring-loaded hinge or through a flexing of the cover). When the outlet port is inserted in the opening, the cover can be pushed aside.

The detection channel 101 includes a fluid sensor for each of the one or more openings, arranged within the detection channel to detect a fluid that is deposited from the outlet port. For example, sensor 118 is arranged within the detection channel to detect the fluid that is deposited from an outlet port that becomes inserted into opening 102. Similarly, sensor 120 is arranged within the detection channel to detect the fluid that is deposited from outlet port 142. Sensor 122 can be arranged within the detection channel to detect the fluid from an outlet port that becomes inserted into opening 106, and sensor 124 is arranged within the detection channel to detect the fluid from outlet port 152 of server chassis 150 which is inserted into opening 108.

In some embodiments, the cover over each of the one or more openings is an elastic cover that bends or hinges adjacent to the one or more openings to allow the outlet port to enter the one or more openings upon insertion. For example, each cover can include a silicone, polymer, and/or other springy flexible material. In some embodiments, the cover is fixed to the detection channel above the opening and bends or hinges to open and close when an outlet port is inserted in the opening. The cover can arrange itself over the opening in a sealed manner. In some aspects, some covers (e.g., 110, 112) may have a sensor attached while others may not. For example, some server chassis may occupy two slots on the IT rack. The detection channel can include different combinations of covers with and without sensors to accommodate a variety of server deployments such as a 1 U or 8 U server.

Since the panel can be serviced from the rear side, the sensor may be added or operated once the rack and IT is deployed. This increase the flexibility of the solution. The detection channel can be serviced from rear side enabling reconfiguring and adjusting the sensors.

As discussed, fluid sensors can use different technologies with different detection sensitivities and costs. As such, placement of the fluid sensors and the structure into which the fluid sensors are placed may determine how accurately a fluid sensor can detect presence of fluid. In some embodiments, the fluid sensor includes a fluid sensor cable that is attached at a bottom edge of each cover, arranged to sense presence of the fluid that is deposited from the respective outlet port. For example, when outlet port 152 is inserted into opening 108, the fluid sensor cable can hang from the cover 116 and position itself within outlet port 152. Referring to FIG. 3B, an outlet port 311 can be open at the top. Side walls 341 and 342 of the outlet port can form a channel in which the fluid flows out of the outlet port. The fluid sensor cable can position itself in that channel between the sidewalls so that the sensor is sufficiently immersed in the fluid to detect its presence during a fluid leak. In such a manner, the accuracy of the fluid sensor can be increased, and the placement of the fluid sensors can indicate which of the server chassis are leaking. Additionally, or alternatively, the fluid sensor can be positioned elsewhere in the detection channel, as described in other sections.

A fluid sensor can include a fluid sensing cable or spot detectors that detect fluid based on electricity—when a fluid makes contact with two electric potentials, then the fluid conducts electricity which causes current to flow through the sensor, which indicates presence of a fluid. These can be understood as conductive sensors. Fluid sensing cables can be advantageously used because they can detect fluid along a distance where the cable is laid out in the detection channel. Additionally, or alternatively, fluid sensors can include optical sensors, capacitive sensors, a diaphragm, a float device, or other fluid sensing technology.

Referring to FIG. 1, the detection channel 101 may be arranged vertically in the IT rack 100 such that fluid falls to a bottom region of the detection channel. The detection channel may have one or more fluid sensors at a bottom region of the detection channel, such as fluid sensors 126 and 128. Fluid sensor 128 can be used for redundancy to detect whether a leak is present in any of the server chassis. A second fluid sensor 126 can be placed within the detection channel at a higher location than fluid sensor 128. The second fluid sensor can be used for system-level safety considerations.

A controller 160 can monitor fluid sensor 128 and, if a leak is detected within sensor 128, the controller can verify whether or not at least another of the fluid sensors placed at an opening has detected fluid. If not, then the controller can initiate a system-level remedial measure such as shutting down power and/or fluid to all server chassis because it would not be known which of the server chassis are leaking. Otherwise, if sensor 124 detects presence of fluid, then the controller can initiate a power down and/or fluid shut-off for server chassis 150, as described in other sections. If fluid is sensed at fluid sensor 126, the controller may initiate a power shutdown and/or fluid shut-off for all server chassis. Thus, one or more fluid sensors can be placed at a bottom region of the detection channel to provide redundancy and additional system-level operation.

The bottom region of the fluid detection sensor can be fully sealed to prevent fluid from escaping the detection channel. The detection channel in the current design can be understood as a fluid collection unit that serves to decrease the impact of the leaked fluid to prevent fluid approaching other areas while also enabling a more efficient manner to implement a leak detection sensor and more accurate leak detection.

Each server chassis can include IT equipment such as a printed circuit board 149 and one or more integrated circuits 148, 147. For each server chassis, a cooling chassis (such as cooling chassis 141) can be attached to the server chassis for transferring thermal energy from or to the IT equipment.

Each cooling chassis can include one or more cold plates such as cold plates 144 and 146, located or fixed at a bottom portion of the cooling chassis. The cold plates can be secured to the cooling chassis in different manners. For example, each cold plate can sit in a cup within the server chassis, the cub being shaped to mate with the geometry of the cold plate. Alternatively, the cold plates can passthrough openings of the cooling chassis and the cold plates and cooling chassis can be joined together in a fully sealed manner that does not allow liquid to pass. Alternatively, the cold plates can be formed as part of the cooling chassis, such as from a common monolithic material (e.g., a metal). Cold plates can be fixed to the server chassis with suitable hardware such as bolts, screws, snaps, clips, or through joining techniques such as pressing, soldering, and/or welding. Other techniques can also be implemented to provide a cooling chassis with one or more cold plates without departing from the scope of the present disclosure.

Fluid lines (not shown) may be arranged in the interior of the cooling chassis to fluidly connect the one or more cold plates to a supply line and a return line. The fluid lines can include a combination of connectors and conduit (e.g., rigid or flexible) that can mate with connectors on the cold plates. The fluid connectors can include dripless blind mate connectors. The supply line and return line can fluidly connect to fluid ports of a rack manifold, as described in other sections.

The cooling chassis 141 may be attached to the server chassis 140 and each of the one or more cold plates (e.g., cold plates 144 and 146) may be attached to a surface of an integrated circuit (e.g., 148 and 147) of IT equipment housed in the server chassis. The integrated circuit can be a surface mountable device (SMD) which can also be referred to as a 'chip' that mounts on a printed circuit board (PCB) 149. The integrated circuit can include one or more heat generating components such as, for example, a high-powered processor or acceleration device of a server.

A cold plate can include fluid lines that are thermally coupled to a heat conductive plate. For example, fluid linescan be machined within or fixed to a side of a thermally conductive plate which can be, for example, a metal plate). The fluid lines of a cold plate can have a meandering or repeating back and forth path to lengthen the flow of fluid evenly across a cold plate. Typically, fluid flows through the lines to absorb thermal energy from the thermally conductive plate, however, cold plates can also transfer thermal energy from the fluid to an electronic component. The thermally conductive plate can have a flat surface that physically and thermally connects to a flat surface of an electronic component such as the integrated circuit. The fluid can include a liquid coolant such as water, propylene glycol, or other liquid coolant technology. The fluid can be a single-phase liquid coolant. The fluid can be a two-phase coolant.

In such a manner, should a fluid leak occur from the cold plates or the fluid lines that are connected to the cold plates, the cooling chassis will capture this fluid and keep it away from the ICs and the PCB. This fluid is directed to the detection channel where the leaked fluid can be detected. The fluid is fully contained in the cooling system, including the fluid leaking out of the loop in a failure incident.

The controller 160 can be communicatively coupled to each of the fluid sensors to monitor whether a leak is present at a system level or per server chassis. In some aspects, in response to a detected leak, the controller can perform a shutdown of IT equipment, for example, by communicating to the IT equipment to perform a software shutdown. Additionally, or alternatively, the controller can shut off electric power to the IT equipment in response to a detected leak. The controller can also reallocate operations of IT equipment in a leaking IT rack to IT equipment in another IT rack that is not leaking fluid.

In some embodiments, the controller can reduce a flow of the fluid into the fluid manifold, in response to the fluid in the container being detected. For example, the controller can shutoff a pump that pumps fluid into a manifold of an IT rack, or close a main valve that cuts off fluid flow to the IT equipment. Thus, the fluid within the cooling distribution system can be slowly emptied, to allow the IT equipment to shutdown gracefully. The controller can initiate shutdown of one or more of the electronic components in the IT rack through one or more commands and/or by cutting power to them.

The one or more sensors, pumps, or valves can be hardwired to the controller (e.g., through digital or analog I/O), and/or communicate with the controller through wireless communications. Operations, methods, and processes performed by processing logic of the controller, which can comprise hardware (e.g. circuitry, dedicated logic, etc.), software (e.g., embodied on a non-transitory computer readable medium), or a combination of both. The controller can include a single computing device, or an aggregate of multiple devices that perform operations distributed between the multiple devices.

For example, the controller can include a processor and computer-readable memory that stores instructions for the controller to execute. Additionally, or alternatively, the controller can include one or more electronic circuits that contain processing logic that monitors whether a leak is present. In some embodiments, the controller can include programmable logic such as FPGAs or CPLDs. The one or more fluid sensors can have leads that connect to analog or digital inputs of the controller 160. Additionally, or alternatively, the one or more fluid sensors can communicate to controller 160 over a communication bus (e.g., RS232, CAN, etc.).

Figure 2:
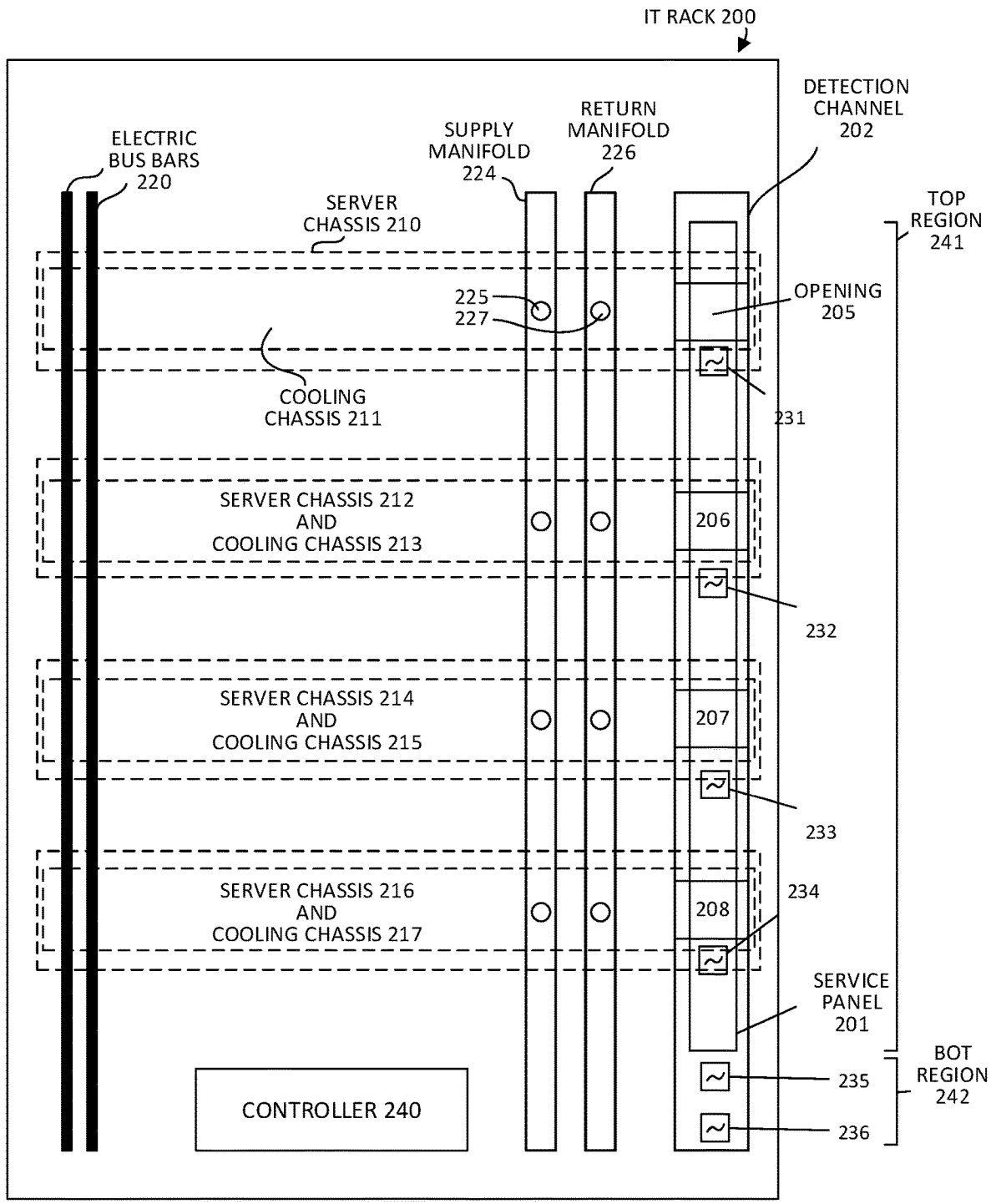
FIG. 2 shows an example of an IT rack with a leak detection system and other components, according to some embodiments.

FIG. 2 shows an example of an IT rack with leak detection and protection, according to some embodiments. In this example, a back view of the IT rack is shown, however, this could also be a front view or side view, depending on the design of the IT rack. Aspects described can apply to different IT rack designs.

The IT rack can include electric bus bars 220 which can deliver electricity to IT equipment that is housed in one or more server chassis such as server chassis 210, 212, 214, and 216. Each server chassis can have a respective cooling chassis 211, 213, 215, and 217 installed upon it. Each cooling chassis can have a fluid line that connects to a fluid supply manifold 224 and a second fluid line that connects to a fluid return manifold 226. The supply manifold and return manifold can be understood collectively as a fluid manifold. The fluid supply manifold 224 can receive fluid from an external fluid supply source and supply the fluid to IT equipment in an IT rack. The fluid flows through each cooling chassis and then flows back to the return manifold. The return manifold receives the fluid from the IT equipment and returns that fluid to an external liquid source. As such, the manifold serves as a central distribution structure that circulates fluid to and from the IT equipment in the IT rack. This fluid can be referred to as IT rack level fluid. In some embodiments, the IT rack level fluid can be fluidly isolated from an external fluid, but thermally connected to it (e.g., via a heat exchanger).

Thermal energy can be transferred away from IT equipment as the fluid circulates through thermally conductive parts such as cold plates that are also thermally connected to the IT equipment. As mentioned, however, leaks can spring along the path of the fluid. In particular, fluid lines that carry fluid to and from the cold plates of the cooling chassis can have numerous transitions and connection points, thus presenting numerous points of failure. It is appreciated that fluid failures typically do not project fluid outward from openings in an explosive manner. Rather, fluid failures tend to manifest with fluid leaking, dripping, and/or traveling on a structure guided by gravity. As such, the cooling assemblies can catch leaked fluid and direct the flow of this leaked fluid to detection channel 202.

As shown, the detection channel may include a plurality of openings, each of the plurality of openings receiving one of a plurality of outlet ports of a respective cooling chassis. For example, cooling chassis 211 can have a cooling chassis with an outlet port that is inserted in opening 205. Similarly, cooling chassis 213 can have its own cooling chassis with its own outlet port that is inserted in opening 206, and so on.

In some embodiments, the detection channel 202 is arranged vertically along the IT rack. For example, the detection channel can have a long unimpeded path with the length of the path traveling vertically in the IT rack. One or more fluid sensors 204 may be arranged at a bottom region of the detection channel. As such, leaked fluid that pools in the detection channel can trigger the fluid sensors and remedial measures can be taken by controller 240, such as shutdown of electronics, shutting the fluid flow, and/or transferring operations to another server chassis or server rack. The detection channel may include a service panel 201 that can be opened or removed. This service panel can be accessible from a rear of the IT rack so that the fluid sensors can be installed or removed even after deployment of the IT rack in the field. The detection channel can include one or more sensors (e.g., 231, 232, 233, 234) that are positioned adjacent to each of the openings. The detection channel can include a service panel 201 that can be opened and/or removed. The panel can be accessible from a rear portion of the IT rack, thus allowing servicing, installation, and removal or a fluid sensor before and after deployment of the IT rack. Thus, the IT rack, in terms of its detection channel sensors implementation can be reconfigured in a flexible manner before and after deployment. The service panel 201, as well as openings (e.g., 205, 206, 207, 208), ledges (not shown), and sensors (e.g., 231, 232, 233, 234) can be located at a top region 241 of the detection channel. One or more system level fluid sensors (e.g., 235, 236) can be located at a bottom region 242 of the detection channel, which can be a sealed region of the detection channel. Thus, the detection channel can have a top region that is not sealed, and a bottom region that is sealed to hold leaked fluid. The bottom region can include the base of the detection channel that serves as a collector that contains the leaked fluid. Each server chassis can connect to fluid ports 225, 227 on the manifold. The fluid ports 225 and 227 can be understood as fluid connectors, such as manual mating dripless connectors, blind mating dripless connectors, or other connectors. Each server chassis can connect to each fluid port of with corresponding mating connectors. Although not shown, the manifold can be received from and returned to an external fluid ecosystem that can include a chiller, refrigeration, a fan, and/or other cooling techniques. Similarly, although not shown, each of the fluid lines may have connectors that mate with connectors of each cold plate. The fluid lines can be rigid or flexible, and can be made of metal, plastic, or other suitable materials. In some embodiments, as discussed in other sections, the controller 240 may fluidly disconnect a server chassis from the manifold in response to when a leak is detected from that server chassis.

In some embodiments, the electric bus bars run vertically along a first side of the IT rack, and the detection channel runs vertically along a second side that is opposite or away from the first side. As such, each cooling chassis may divert leaked fluid away from the electric bus bars towards the detection channel. It should be understood that, although shown with four server chassis, the number of server chassis in an IT rack can vary without departing from the scope of the disclosure.

Figure 3A:
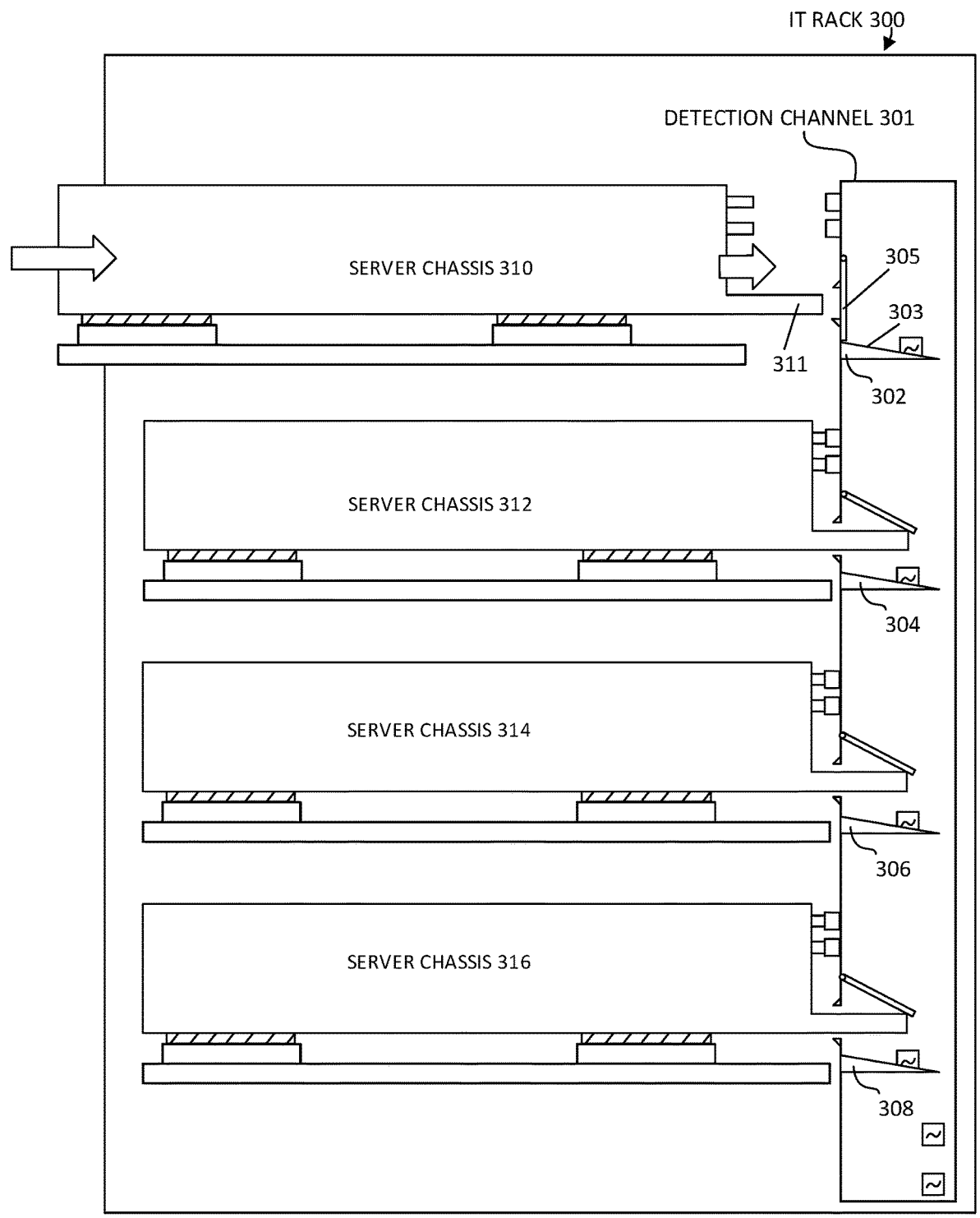
FIG. 3A and FIG. 3B shows a leak detection system for an IT rack with one or more ledges extended within a detection channel, according to some embodiments.
Figure 3B:
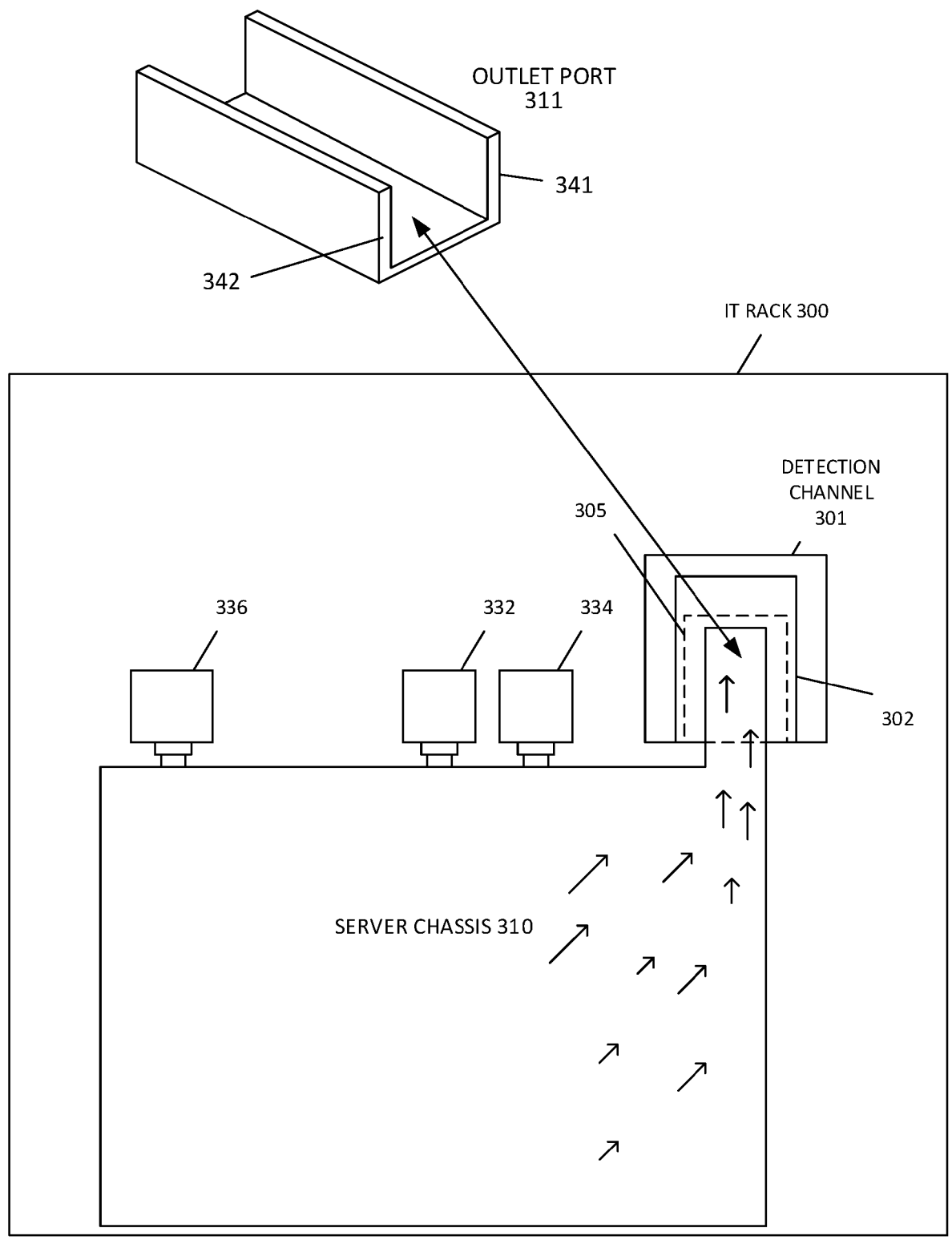

FIG. 3A and FIG. 3B shows a leak detection system for an IT rack with one or more ledges extended within a detection channel, according to some embodiments. IT rack 300 can include IT equipment that is housed in each of server chassis 310, 312, 314, and 316, as discussed in other sections. Similarly, each server chassis can include a respective cooling chassis (not shown) as described in other sections. The outlet port 311 can be open at a top region of the outlet port. Sidewalls 342 and 341 can extend vertically from a floor of the outlet port to form a channel through which the leaked fluid can flow out of the server chassis and into the detection channel. As discussed in other sections, a fluid sensor cable that is attached to a cover of an opening can position itself in that channel of the outlet port between the sidewalls 342 and 341 so that the sensor is sufficiently immersed in the fluid to detect its presence during a fluid leak. As shown in the top view of FIG. 3B, when server chassis 310 is installed upon the IT rack 300, the server chassis can fluidly connect to supply and return manifold 332, 334. Further, the server chassis can electrically connect to bus bars 336. The server chassis can be installed by pushing the server chassis into the IT rack thereby mating the connectors of the server chassis with connectors of the manifold and bus bars. The opening of the detection channel can be aligned such that the outlet port 311 inserts directly into the opening when the connectors are mated. Likewise, the fluid sensors can be located on the cover 305 or ledge 302 to sense the fluid from one of the server chassis when it leaks. In one embodiment, the ledges can be designed in other shape for better leak detection, such as the outlet port 311 designed as a converged manner, with 342 and 341 designed in a trapezoid manner.

As shown in FIG. 3A, the detection channel includes one or more ledges such as, for example, ledges 302, 304, 306 and 308 that extend from a sidewall within the detection channel under a respective one of the one or more openings. Each fluid sensor may be attached to each of the one or more ledges, arranged to sense the fluid that is deposited from the outlet port. Each of the ledges can have a sloped upper surface such as upper surface 303 that carries fluid down and away from the outlet port. The ledges can be vertically aligned with each other in the detection channel so that when fluid flows off of one ledge, the fluid does not land on a fluid sensor of another ledge. In such a manner, a leak from one server chassis may not trip a fluid sensor that is dedicated to sensing fluid from a different server chassis that is below the leaking server chassis.

In some aspects, each ledge has a wedge-shape as shown. A ledge can take various shapes. For example, a ledge can include a trough for the fluid that is received from the outlet port to flow through. The fluid sensor may be located in the trough which can improve immersion of the fluid sensor in the fluid, thereby improving accuracy of the fluid sensor.

Figure 4A:
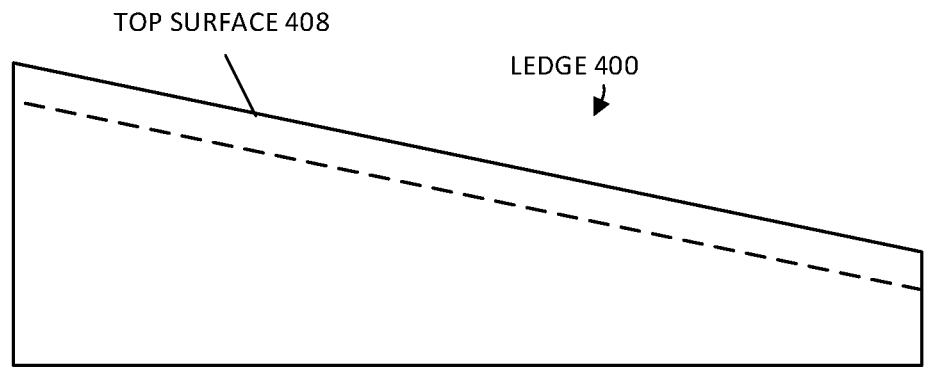
FIG. 4A and FIG. 4B shows an example ledge, according to some embodiments.
Figure 4B:
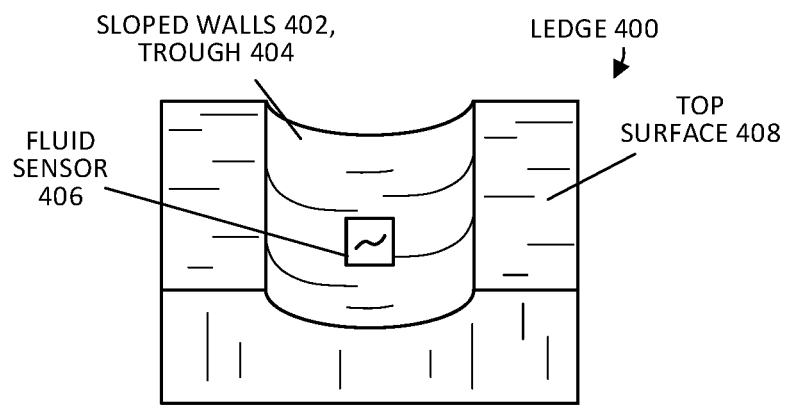

FIG. 4A and FIG. 4B shows an example ledge, according to some embodiments. The ledge 400 can have a top surface 408 that slows downward, thereby aiding the flow of the leaked fluid in a controlled manner. In the top surface, a trough 404 can be formed from sloped walls 402 that extend downward from the top surface to form a U-shaped trough. The trough can be understood as a channel or path in which the fluid flows through after being deposited by the outlet port. Fluid sensor 406 can reside at least partially in the trough, to improve fluid immersion and accuracy of the fluid sensor. In one embodiment, a notch maybe designed with the 402 and 404, to implement the sensors.

Figure 5A:
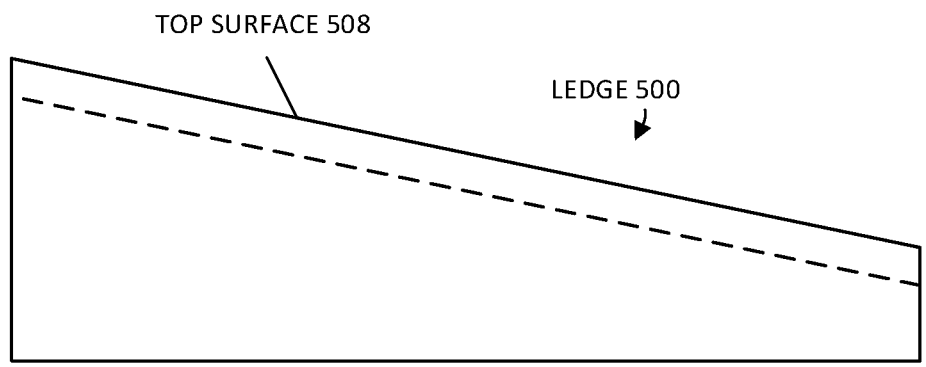
FIG. 5A and FIG. 5B shows an example ledge, according to some embodiments.
Figure 5B:
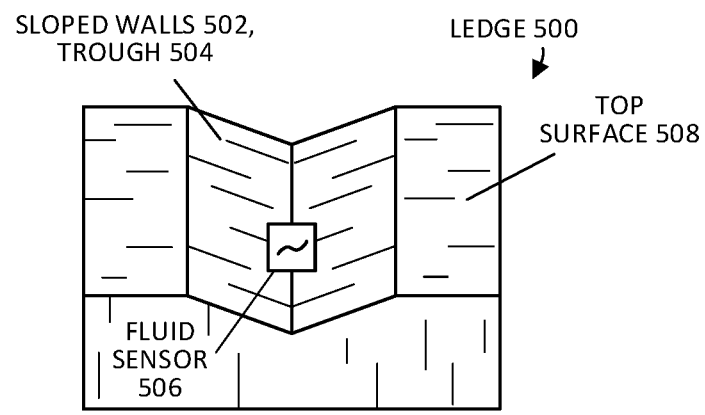

FIG. 5A and FIG. 5B shows an example ledge, according to some embodiments. The ledge 500 can have a top surface 508 that slows downward, thereby aiding the flow of the leaked fluid in a controlled manner. In the top surface, a trough 504 can be formed from sloped walls 502 that extend downward from the top surface to form a V-shaped trough. Fluid sensor 506 can reside at least partially in the trough, to improve fluid immersion and accuracy of the fluid sensor. Although some examples are shown, the ledge can take on various shapes that channel the fluid flow and improve accuracy of fluid sensors without departing from the scope of the present disclosure.

Figure 6:
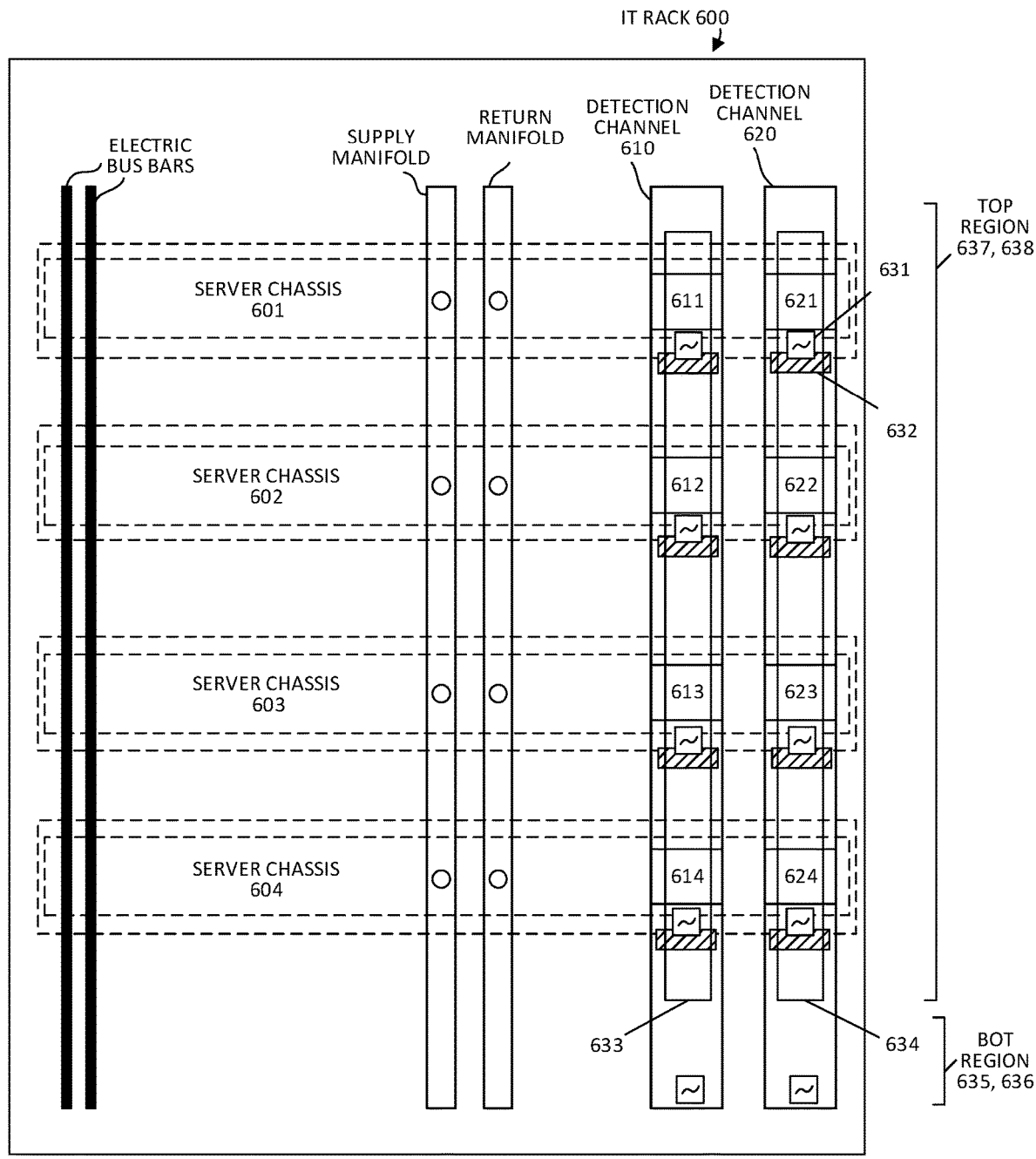
FIG. 6 shows an IT rack having a plurality of detection channels, according to some embodiments.

FIG. 6 shows an IT rack with cooling chassis having a plurality of detection channels, according to some embodiments. IT rack 600 can include a detection channel 610 and one or more additional detection channels 620. Each detection channel can include a respective opening that receives an additional outlet port of the cooling chassis or an outlet port of a different cooling chassis.

For example, detection channel 610 can include openings 611, 612, 613, and 614 that each receive an outlet port of some server chassis such as 601, 602, 603, and 604. Similarly, detection channel 620 can include openings 621, 622, 623, and 623 that receive an outlet port of some of server chassis such as 601, 602, 603, and 604.

For example, server chassis 601 can have an outlet port that resides in opening 611, while server chassis 602 can have an outlet port that resides in opening 622. As such, server chassis can be grouped into different detection channels. A controller can generate a notification or an error log that can be accessed electronically to perform maintenance or trouble shooting. In some examples, a cooling chassis can have more than one outlet port. For example, on a large IT rack, the cooling chassis may divert the leaked fluid to separate outlet ports. In such an example, cooling chassis 601 can have two outlet ports, a first outlet port that is inserted into opening 611 and a second outlet port that is inserted into opening 621. In one embodiment, cooling assemblies 601 and 602 may each have an outlet port that is inserted in openings 621 and 622 respectively, and cooling assemblies 603 and 604 may each have an outlet port that is inserted in openings 613 and 614, respectively.

As described, one or more of the openings of a detection channel can have a sensor such as fluid sensor 631 that is arranged to detect fluid deposited from one of the outlet ports inserted in the opening. The sensors can be fixed to a ledge such as ledge 632, or fixed to a cover of the opening, as described in other sections. Further, each detection channel can have a panel such as panels 633, 634, that can be removed or opened from a rear section of the IT rack. The panel can be open to service a top portion of each detection channel. As described, the panel can be located at top regions (e.g., 637, 638) of each detection channel. Below the panel, a bottom region 635 and 636 of the detection channel is sealed to capture and hold leaked fluid.

Figure 7:
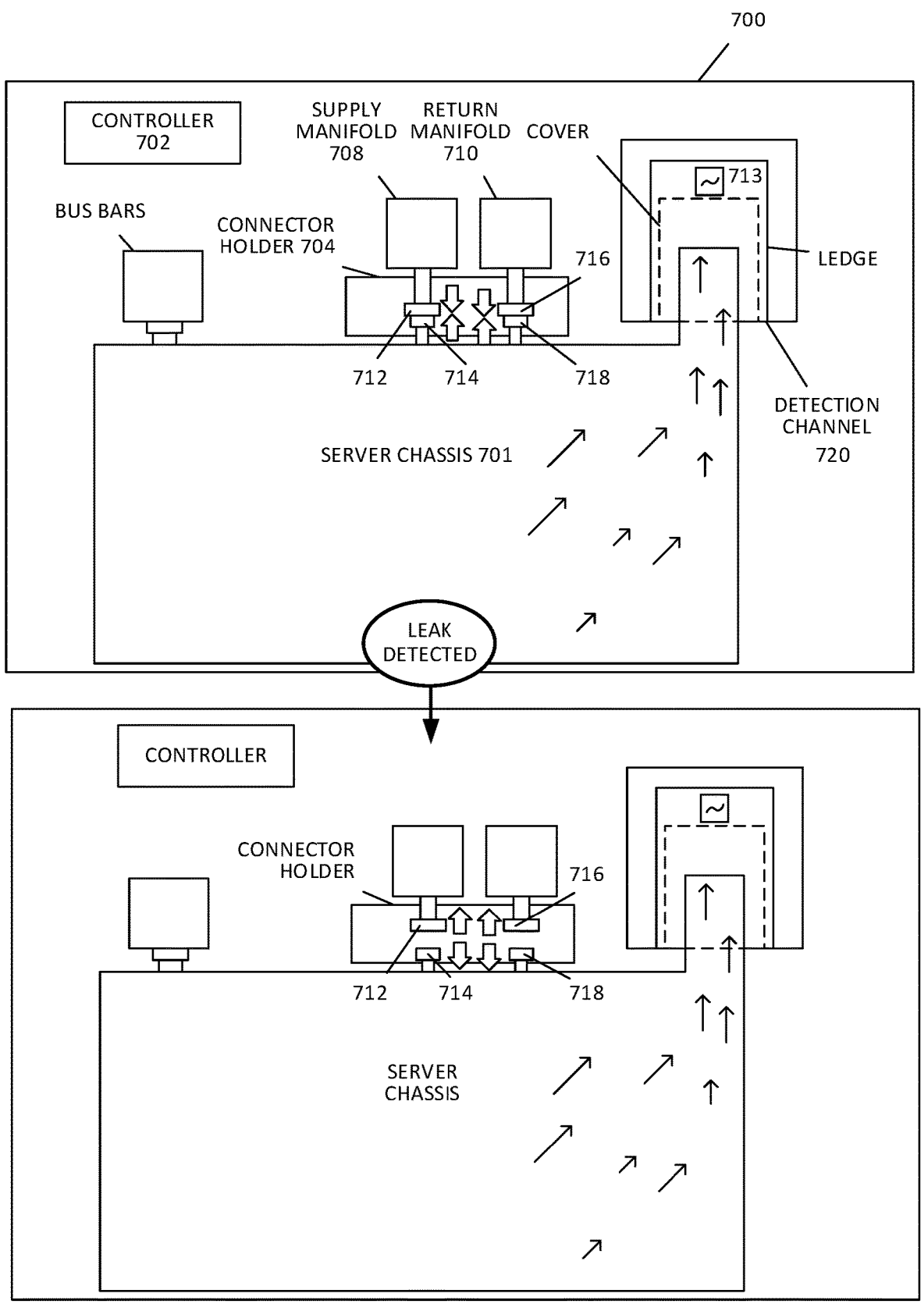
FIG. 7 shows a leak detection system with responsive fluid management, according to some embodiments.

FIG. 7 shows a leak detection system with responsive fluid management, according to some embodiments. An IT rack 700 can include a detection channel 720 into which an outlet port of a server chassis 701 is inserted into, as described in other sections. When installed, the server chassis 701 may have fluid connectors 714 and 718 that mate with fluid connectors 712 and 716 respectively, to fluidly connect the server chassis to the supply manifold 708 and return manifold 710.

The connectors 712, 714, 716, and 718 can include blind-mate dripless connectors that mate when pressed together and are self-shutting such that they do not leak fluid when disconnected apart. Dripless connectors can include spring-loaded valves or other mechanisms that cut the flow of fluid through the connector when in a disconnected state. Connectors 714,718 and/or connectors 712,716 may be attached to a connector holder 704. The IT rack 700 can include a connector holder for each server chassis position in the IT rack.

A controller 702 may be communicatively coupled to a fluid sensor 713 which can be attached to the opening cover or the ledge as described in other sections. Controller 702 can be configured to, in response to detection of the fluid (e.g., at fluid sensor 713), fluidly disconnect the server chassis 701 from a fluid supply line and/or a fluid return line.

For example, the controller can force the mated connectors 714, 712 and/or 718, 716 apart. In some embodiments, the controller can command one or more actuators on the connector holder 704 to exert a separating force on the mated connector pairs to separate them. As such, the controller can fluidly isolate a server chassis that is deemed to be leaking. In one embodiment, the supply and return connector may be separated at different times.

Additionally, or alternatively, the server chassis can initiate a software and/or hardware shutdown of the electronics within the server chassis. For example, the controller can cut electric power from the bus bars to the server chassis and/or send a signal to the server chassis to perform a software shutdown which can include error logging, shifting operations to a different server chassis, entering a shutdown state, storing content into memory, and/or other operations to facilitate a shutdown in a manner that reduces impact to users and damage to equipment.

The controller can maintain normal operation of the remaining server chassis on the IT rack, which can include fluid and power distribution to those remaining server chassis. In such a manner, reliability of servers can be improved, leaking server chassis in an IT rack can be isolated and shutdown while other server chassis can maintain operation.

Although not shown, an IT rack can, in some embodiments, include various other supporting components. For example, an IT rack can include a cooling distribution unit (CDU), a rack management unit (RMU). The server chassis can also be referred to as a server blade that can be inserted into an array of server slots respectively from frontend or backend of the IT rack. An IT rack can be either open to the environment or partially contained by a rack container. The IT rack can include one or more cooling fans that can generate airflow from a frontend to a backend of the IT rack. In some embodiments, an IT rack may include a cooling fan for each server chassis. The cooling fans may be mounted on each server chassis to generate airflow through the server chassis. In some embodiments, the CDU can include a heat exchanger, liquid pump, a pump controller, a fluid reservoir, a power supply, sensors and more. The CDU's heat exchanger may be a liquid-to-liquid heat exchanger that includes a first loop with inlet and outlet ports having a first pair of liquid connectors coupled to external liquid supply/return lines to form a primary loop. The liquid supply/return lines may be fluidly connected to a set of room manifolds, which may be coupled to an external heat removal system, or external cooling loop. In addition, the heat exchanger may further include a second loop with two ports having a second pair of liquid connectors coupled to the fluid manifold to form a secondary loop that fluidly supplies and returns fluid between one or more server chassis and the CDU.

Each of the server chassis may house one or more servers which may include one or more components such as, for example, central processing units or CPUs, graphical processing units (GPUs), memory, and/or storage devices. Each component may perform data processing tasks, where the component may include software installed in a storage device, loaded into the memory, and executed by one or more processors to perform the data processing tasks. At least some of these components may be attached to the bottom of any of the cold plates as described above. A server may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

An IT rack may further include an optional RMU configured to provide and manage power supplied to servers, fan modules, and the CDU. The RMU may be coupled to a power supply unit to manage the power consumption of the power supply unit. The power supply unit may include the necessary circuitry (e.g., an alternating current (AC) to direct current (DC) or DC to DC power converter, backup battery, transformer, or regulator, etc.,) to provide power to the rest of the components of the IT rack.

Aspects of the cooling distribution system can be flexible and deployable in different system architectures; for example, the system can be deployed with a localized pumping system (e.g., a closed system architecture) or central pumping system (e.g., an open system architecture). Aspects described can simultaneously separate IT equipment from leaked fluid and direct leaked fluid to pool in a common location for detection, thereby minimizing the impact of a fluid leak and increasing overall system reliability.

Some embodiments may include a non-transitory machine-readable medium (such as microelectronic memory) having stored thereon instructions, which program one or more data processing components (generically referred to here as a "processor") to perform operations described herein. In some embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A leak detection system for an IT rack, comprising:
   a detection channel, including
      one or more openings that is each to receive an outlet port of a server chassis installed in the IT rack;
      a cover for each of the one or more openings that is arranged over the one or more openings when the outlet port is not present in the one or more openings and moves to allow entrance of the outlet port when the outlet port is inserted into the one or more openings; and
      a fluid sensor for each of the one or more openings, arranged within the detection channel to detect a fluid that is deposited from the outlet port.

2. The leak detection system of claim 1, wherein the cover over each of the one or more openings is an elastic cover that bends or hinges adjacent to the one or more openings to allow the outlet port to enter the one or more openings upon insertion.

3. The leak detection system of claim 1, wherein the fluid sensor includes a fluid sensor cable that is attached at a bottom edge of each cover, arranged to sense presence of the fluid that is deposited from the respective outlet port.

4. The leak detection system of claim 1, wherein the detection channel includes one or more ledges that extend from a sidewall within the detection channel under a respective one of the one or more openings, wherein the fluid sensor is attached to each of the one or more ledges, arranged to sense the fluid that is deposited from the outlet port.

5. The leak detection system of claim 4, wherein the one or more ledges has a trough for the fluid that is received from the outlet port to flow through, and the fluid sensor is located in the trough.

6. The leak detection system of claim 1, wherein the outlet port extends from a cooling chassis that is attached to the server chassis, the cooling chassis having one or more cold plates that is thermally coupled to electronics of the server chassis, and the fluid that leaks from within the cooling chassis is isolated from the electronics and directed to flow out of the outlet port.

7. The leak detection system of claim 1, wherein a controller is communicatively coupled to the fluid sensor, and the controller is configured to, in response to detection of the fluid, fluidly disconnect the server chassis from a fluid supply line or a fluid return line.

8. The leak detection system of claim 7, wherein the detection channel includes a service panel that is accessible from a rear portion of the IT rack that provides an unimpeded access to the fluid sensor for each of the one or more openings.

9. The leak detection system of claim 7, wherein the controller is further configured to, in response to the detection of the fluid, initiate a shutdown of electronics housed in the server chassis or a transfer of operations performed by the server chassis that is associated with the detection of the fluid to another server chassis.

10. The leak detection system of claim 1, wherein the detection channel is arranged vertically along the IT rack and additional one or more fluid sensors are located at a bottom region of the detection channel.

11. An information technology (IT) rack, comprising:
    IT equipment housed in one or more server chassis; and
    a detection channel having
       one or more openings that is each to receive an outlet port of each of the one or more server chassis;
       a cover for each of the one or more openings that is arranged over the one or more openings when the outlet port is not present in the one or more openings and moves to allow entrance of the outlet port when the outlet port is inserted into the one or more openings; and
       a fluid sensor for each of the one or more openings, arranged within the detection channel to detect a fluid that is deposited from the outlet port.

12. The IT rack of claim 11, wherein the cover over each of the one or more openings is an elastic cover that bends or hinges adjacent to the one or more openings to allow the outlet port to enter the one or more openings upon insertion.

13. The IT rack of claim 11, wherein the fluid sensor includes a fluid sensor cable that is attached at a bottom edge of each cover, arranged to sense presence of the fluid that is deposited from the respective outlet port.

14. The IT rack of claim 11, wherein the detection channel includes one or more ledges that extend from a sidewall within the detection channel under a respective one of the one or more openings, wherein the fluid sensor is attached to each of the one or more ledges, arranged to sense the fluid that is deposited from the outlet port.

15. The IT rack of claim 14, wherein the one or more ledges has a trough for the fluid that is received from the outlet port to flow through, and the fluid sensor is located in the trough.

16. A data center comprising:
    a plurality of Information Technology (IT) racks, one or more of the IT racks including:
       IT equipment housed in one or more server chassis;
       a detection channel having
          one or more openings that is each to receive an outlet port of each of the one or more server chassis;
          a cover for each of the one or more openings that is arranged over the one or more openings when the outlet port is not present in the one or more openings and moves to allow entrance of the outlet port when the outlet port is inserted into the one or more openings; and
          a fluid sensor for each of the one or more openings, arranged within the detection channel to detect a fluid that is deposited from the outlet port.

17. The data center of claim 16, wherein the cover over each of the one or more openings is an elastic cover that bends or hinges adjacent to the one or more openings to allow the outlet port to enter the one or more openings upon insertion.

18. The data center of claim 16, wherein the fluid sensor includes a fluid sensor cable that is attached at a bottom edge of each cover, arranged to sense presence of the fluid that is deposited from the respective outlet port.

19. The data center of claim 16, wherein the detection channel includes one or more ledges that extend from a sidewall within the detection channel under a respective one of the one or more openings, wherein the fluid sensor is attached to each of the one or more ledges, arranged to sense the fluid that is deposited from the outlet port.

20. The data center of claim 19, wherein the one or more ledges has a trough for the fluid that is received from the outlet port to flow through, and the fluid sensor is located in the trough.

\* \* \* \* \*